United States Patent
El-Khoury et al.

(10) Patent No.: US 7,408,396 B2
(45) Date of Patent: Aug. 5, 2008

(54) HIGH VOLTAGE PROTECTION CIRCUIT

(75) Inventors: Hassane El-Khoury, Holly, MI (US);
Kurt Psotka, Eschborn (DE)

(73) Assignee: Continental Teves, Inc.

( * ) Notice: Subject to any disclaimer, the term of this patent is extended or adjusted under 35 U.S.C. 154(b) by 261 days.

(21) Appl. No.: 11/437,119

(22) Filed: May 18, 2006

(65) Prior Publication Data

US 2007/0268058 A1  Nov. 22, 2007

(51) Int. Cl.
*H03L 5/00* (2006.01)
*H02H 9/04* (2006.01)

(52) U.S. Cl. .................. 327/318; 327/308; 333/81 R; 361/88; 361/91.1

(58) Field of Classification Search .................. 327/308, 327/318–321, 325–328, 378–383, 389, 391, 327/427, 430, 431, 434–437; 333/101, 81 R; 361/88, 90, 91.1, 91.2, 91.5, 91.6

See application file for complete search history.

(56) References Cited

U.S. PATENT DOCUMENTS

| | | | | |
|---|---|---|---|---|
| 2,829,281 | A * | 4/1958 | Wilhel | 327/482 |
| 5,088,018 | A | 2/1992 | Lee | |
| 5,903,177 | A * | 5/1999 | Schwab et al. | 327/308 |
| 6,556,401 | B1 | 4/2003 | Loewen et al. | |
| 6,606,227 | B2 * | 8/2003 | Rapsinski et al. | 361/86 |
| 6,670,724 | B2 * | 12/2003 | Ely et al. | 307/10.1 |
| 6,856,495 | B2 * | 2/2005 | Ely | 361/18 |
| 6,882,513 | B2 * | 4/2005 | Laraia | 361/91.1 |
| 7,250,804 | B2 * | 7/2007 | Brindle | 327/365 |
| 2004/0052022 | A1 * | 3/2004 | Laraia | 361/91.1 |

* cited by examiner

*Primary Examiner*—N. Drew Richards
*Assistant Examiner*—Patrick O'Neill
(74) *Attorney, Agent, or Firm*—Craig Hallacher

(57) ABSTRACT

Disclosed is a circuit to provide protection from an over voltage signal. The circuit protects against load dumps or positive transients applied to any electronic unit. The circuit isolates the protected circuitry from the transient voltage by two ways. The circuit limits the current flow and clamping the voltage using a small package zener diode. Additionally, the circuit causes a specific voltage drop between the applied transient and the protected circuit.

10 Claims, 1 Drawing Sheet

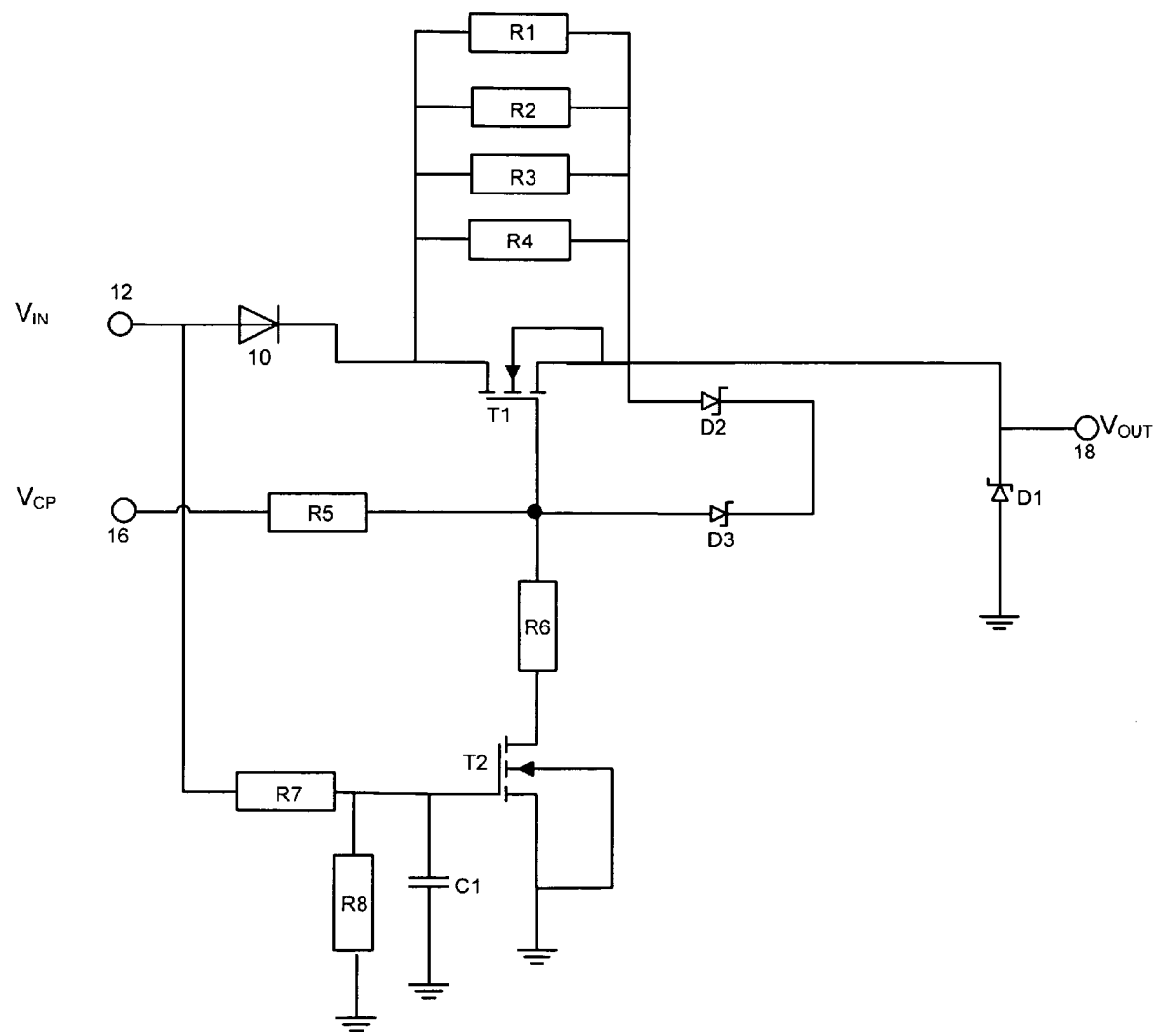

HIGH VOLTAGE PROTECTION CIRCUIT

BACKGROUND OF THE INVENTION

The present invention relates to a high voltage protection circuit as it is used in electronic systems that may be exposed to sudden high voltage spikes. The circuit may be used to protect electronic devices that operate on a relative low voltage but are subject to sudden peak voltages. For example, in an electronic brake system (EBS) of a vehicle, circuitry is designed to operate at or below 40 volts. However, when a load dump or positive transient occurs, the voltage applied to components may greatly exceed the maximum voltage causing failure.

One circuit arrangement for overload protection is shown by U.S. Pat. No. 6,556,401 (Loewen et al.). The overload protection circuit includes a third circuit path. The third circuit path is between the first circuit path and a connection of a field-effect transistor which is coupled to the second input connection, and includes the source/drain path of a second field-effect transistor. The third circuit path is completed if an overload occurs between the first and the second input connection. The gate connection of a field-effect transistor is connected to a potential in the first circuit path between the first input connection. The first output connection, and the gate connection of the second field-effect transistor is connected to a potential in the second circuit path between the second output connection and that connection of the first field-effect transistor which is coupled to the second output connection. However, this system is ineffective in protecting against spikes caused by a load dump or positive transient occurrence.

A second circuit arrangement for overload protection is shown by U.S. Pat. No. 6,411,481 (Seubert). A switch and load are connected in series between the terminals of a voltage source. The switch is triggered to release the current flow in the load if the voltage exceeds a threshold value. This device suffers from needing extra switches causing extra costs and size to the system.

It is therefore an object of the current invention to suggest a circuit design that protects from large voltage spikes, yet is inexpensive to make and small in size. It is a further object of the invention to provide adequate protection with minimal additional components that can be used with current production electronic circuits.

SUMMARY OF THE INVENTION

These and other objects and advantages are achieved by a circuit arrangement disclosed herein. The overload circuit isolates the protected circuitry from transient voltage in two different manners. First, the overload protection circuit limits the current flow and clamps the voltage by using a small package zener diode. Second, the overload protection circuit causes a specific voltage drop between the applied transient and the protected circuit.

Another advantage of the invention is the overload protection circuit provides an output voltage that is clamped at an acceptably low level, allowing current production devices to operate properly.

A particularly simple construction is obtained with the disclosed device allowing for inexpensive manufacture, limited additional parts, and a small footprint of the circuit.

Further details and advantages can be gathered from the following description and two drawings.

BRIEF DESCRIPTION OF THE DRAWING

In the figure:
FIG. 1 shows the overload protection circuit.

DETAILED DESCRIPTION OF THE DRAWING

Reference will now be made in detail to the presently preferred embodiments of the invention, examples of which are illustrated in the accompanying drawings, wherein like reference numerals refer to like elements throughout.

FIG. 1 shows an overload protection circuit useful in protecting electronics, such as EBS components, in a motor vehicle. Diode 10 is a reverse voltage and negative transient protection diode used only when the terminal 12 is connected to a voltage source, such as a battery. Diode 10 is connected in series between terminal 12 and n-channel MOSFET T1. Resistors R1, R2, R3, and R4 are connected in parallel across the drain and source of MOSFET T1. The source of MOSFET T1 is connected to the output terminal 18 and includes a connection to zener diode D1. Zener diode D1 acts as a voltage clamping diode. Resistors R1, R2, R3, R4, and R6 act as current limiting resistors, R5 acts as a pull up resistor while resistors R7, R8 with capacitor C8, act as a voltage divider and low pass filter. Diodes D2 and D3 are gate protection diodes, protecting the gate of T1 from excessive voltages. MOSFET T1 acts as a circuit isolation transistor while MOSFET T2 controls the gate of T1.

In normal operation the voltage in to terminal 12 is within normal operating range, $V_{Gate\_T2} < V_{Gate\_T2\_Off\_Threshold}$, and T2 is off. When T2 is off, the voltage of the pulled up to $V_{CP}$, applied to terminal 16, by resistor R5. $V_{CP}$ is an applied voltage selected to be a value enough to turn on transistor T1. For example, $V_{CP}$ at a minimum, must be set to $V_{IN} + V_{Gate\_T1\_On\_Threshold}$. When transistor T1 is on, current flows through it and there is no drop across resistors R1 through R4.

In protective operation, the voltage $V_{IN}$ increases over the normal operating range. When $V_{Gate\_T2} > V_{Gate\_T2\_On\_Threshold}$, transistor T2 is turned on. When transistor T the gate of transistor T1 is pulled to ground by resistor R6, shutting transistor T1 off. Current flows through resistors R1 through R4, which causes the voltage to drop across the path of the parallel resistors. Thus, when $V_{IN}$ exceeds a threshold voltage, the voltage $V_{OUT}$ is decreased by the voltage drop across resistors R1 through R4 without necessitating a separate current path. The circuit returns to normal operation when $V_{Gate\_T2}$ drops below the threshold $V_{Gate\_T2\_On\_Threshold}$.

In applications, such as a motor vehicle, circuitry often has a maximum voltage which is lower than possible peaks. For example, power control units (PCU) often have a maximum voltage of 40V. During a load dump, the voltages applied to the PCU may far exceed this maximum voltage threshold, and the circuit of FIG. 1 may be used to protect the PCU from these harmful voltages.

During the aforementioned load dump, transistor T2 is activated when $V_{IN}$ reaches predetermined set threshold value, such as 30V. The activation of transistor T2 causes transistor T1 to be turned off. The PCU current, approximately 300 mA generates a voltage drop across the resistors R1 through R4. If resistors R1 through R4 are each approximately 40 Ohm resistors, the voltage drop is approximately 3V.

This enables the current load dump protection circuit to be implemented in scenarios where voltages reach values higher than the 40 V threshold voltage without harming the PCU.

This circuit can be adjusted by component selection to switch on at any required voltage, have a predetermined voltage drop based on current draw and clamp the output voltage to any safe maximum voltage.

An additional use of the circuit described above is to provide an output voltage that is clamped under a set value, such as 28V. In many vehicles, the PCU has a threshold voltage of 28V, causing the PCU to activate a pump motor FET.

The many features and advantages of the invention are apparent from the detailed specification. Thus, the appended claims are to cover all such features and advantages of the invention that fall within the true spirit and scope of the invention. Furthermore, since numerous modifications and variations will readily occur to those skilled in the art, it is not desired to limit the invention to the exact construction and operation illustrated and described. Accordingly, appropriate modifications and equivalents may be included within the scope of the invention.

Although this invention has been illustrated by reference to specific embodiments, it will be apparent to those skilled in the art that various changes and modifications may be made which clearly fall within the scope of the invention.

What is claimed is:

1. A high voltage protection circuit comprising:
   a input terminal for receiving an input voltage;
   an output terminal for outputting an output voltage;
   a first transistor providing a circuit path between the input terminal and the output terminal:
   a second transistor providing a path between a gate of the first transistor and the ground terminal; and
   one or more resistors connecting across a drain and source of the first transistor, wherein an input voltage that is greater than a predetermined threshold voltage activates the second transistor, which in turn deactivates the first transistor, causing the one or more resistors to effect a decreased output voltage.

2. The protection circuit according to claim 1, further comprising a second input terminal, wherein the second input terminal receives a second voltage and the second voltage is sufficient to turn-on the first transistor in normal operating conditions.

3. The protection circuit according claim 1, further comprising a diode connected at the source of the first transistor and the output terminal.

4. The protection circuit according to claim 3, wherein the diode is zener diode that acts a voltage clamp.

5. The protection circuit according to claim 1, wherein a circuit acting as a voltage divider and low pass filter is connected between the input terminal and the second transistor.

6. The protection circuit according to claim 5, wherein the circuit acting as a voltage divider and low pass filter comprises at least two resistors and at least one capacitor.

7. The protection circuit according to claim 1, further comprising one or more diodes connected between the source and gate of the first transistor, wherein the one or more diodes act as gate protection diodes.

8. The protection circuit according to claim 1, wherein a diode is connected in series between the input terminal and the first transistor.

9. The protection circuit according to claim 1, wherein the protection circuit is provided in a vehicle, such as a motor vehicle having an electronic brake system, and a component of the electronic brake system is protected by the protection circuit.

10. The protection circuit according to claim 9, wherein the protected component is a power control unit.

* * * * *